(12) United States Patent
Yang et al.

(10) Patent No.: US 12,543,484 B2
(45) Date of Patent: Feb. 3, 2026

(54) DISPLAY DEVICE

(71) Applicant: Samsung Display Co., LTD., Yongin-si (KR)

(72) Inventors: Gihoon Yang, Hwaseong-si (KR); Taemin Kim, Hwaseong-si (KR); Jiyun Park, Hwaseong-si (KR); Donggeun Shin, Pyeongtaek-si (KR); Seulgee Lee, Seoul (KR); Ho Lim, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 382 days.

(21) Appl. No.: 18/086,637

(22) Filed: Dec. 21, 2022

(65) Prior Publication Data

US 2023/0371306 A1 Nov. 16, 2023

(30) Foreign Application Priority Data

May 10, 2022 (KR) ........................ 10-2022-0057454

(51) Int. Cl.
*H10K 59/80* (2023.01)
*H10K 59/38* (2023.01)

(52) U.S. Cl.
CPC ......... *H10K 59/8791* (2023.02); *H10K 59/38* (2023.02); *H10K 59/8792* (2023.02)

(58) Field of Classification Search
CPC ............ H10K 59/8731; H10K 50/844; H10K 50/8445; H10K 59/873; H10K 50/865; H10K 59/126; H10K 59/30; G02B 1/11
See application file for complete search history.

(56) References Cited

U.S. PATENT DOCUMENTS

2015/0072124 A1\* 3/2015 Sakaguchi ........... G02B 5/3033
428/688
2018/0374409 A1\* 12/2018 Lee ........................ H10K 50/11
(Continued)

FOREIGN PATENT DOCUMENTS

JP          5370150 B2 \* 12/2013 ............. G02B 1/111
KR    1020120002380         1/2012
(Continued)

OTHER PUBLICATIONS

Korean Office Action for Korean Application No. 10-2022-0057454; Report Mail Date Dec. 10, 2025 (11 Pages; with translation).

*Primary Examiner* — Alia Sabur
(74) *Attorney, Agent, or Firm* — CANTOR COLBURN LLP

(57) ABSTRACT

A display device includes: a substrate including first, second, and third emitting areas and a light blocking area surrounding the first, second, and third emitting areas; light emitting elements disposed in the first, second, and third light emitting areas, respectively, on the substrate; a color conversion layer including a first color conversion pattern, a second color conversion pattern, and a light transmission pattern disposed in the first, second, and third emitting areas on the light emitting elements; a light blocking layer disposed in the light blocking area on the color conversion layer, an anti-reflection layer covering the light blocking layer on the color conversion layer, and a low reflection layer disposed on the anti-reflection layer and including a plurality of layers having different refractive indices from each other.

16 Claims, 13 Drawing Sheets

(56) References Cited

U.S. PATENT DOCUMENTS

2019/0113799 A1* 4/2019 Shin .................. H10D 86/60
2020/0258946 A1 8/2020 Kim et al.

FOREIGN PATENT DOCUMENTS

| KR | 1020180000913 | 1/2018 |
| KR | 20200097373 A | 8/2020 |
| KR | 1020210043064 | 4/2021 |
| KR | 1020210134206 | 11/2021 |

* cited by examiner

DISPLAY DEVICE

This application claims priority to Korean Patent Application No. 10-2022-0057454, filed on May 10, 2022, and all the benefits accruing therefrom under 35 U.S.C. § 119, the content of which in its entirety is herein incorporated by reference.

BACKGROUND

1. Field

Embodiments provide generally to a display device. More particularly, embodiments relate to a display device providing visual information.

2. Description of the Related Art

With the development of information technology, the importance of a display device, which is a connection medium between a user and information, has been highlighted. For example, the use of the display device such as liquid crystal display device ("LCD"), organic light emitting display device ("OLED"), plasma display device ("PDP"), quantum dot display device or the like is increasing.

Meanwhile, when the display device is exposed to an external light such as various kinds of lighting and natural light, an image displayed on the display device by the reflected light may not be clearly transmitted to the user. For this reason, a method for reducing the reflectance of the display device due to external light is being studied.

SUMMARY

Embodiments provide a display device with improved display quality.

A display device according to embodiments of the present disclosure includes: a substrate including first, second, and third emitting areas and a light blocking area surrounding the first, second, and third emitting areas; light emitting elements disposed in the first, second, and third light emitting areas, respectively, on the substrate; a color conversion layer including a first color conversion pattern, a second color conversion pattern, and a light transmission pattern disposed in the first, second, and third emitting areas on the light emitting elements; a light blocking layer disposed in the light blocking area on the color conversion layer, an anti-reflection layer covering the light blocking layer on the color conversion layer, and a low reflection layer disposed on the anti-reflection layer and including a plurality of layers having different refractive indices from each other.

In an embodiment, the number of the plurality of layers may be three or four.

In an embodiment, the plurality of layers may include a first inorganic layer disposed on the anti-reflection layer, a second inorganic layer disposed on the first inorganic layer and having a refractive index greater than a refractive index of the first inorganic layer, a third inorganic layer disposed on the second inorganic layer and having a refractive index smaller than a refractive index of the second inorganic layer, and a lower refractive index layer disposed on the third inorganic layer and having a refractive index smaller than a refractive index of the third inorganic layer.

In an embodiment, the refractive index of the first inorganic layer may be about 1.6 to about 1.7 and a thickness of the first inorganic layer may be about 50 nanometers (nm) to about 150 nm.

In an embodiment, the refractive index of the second inorganic layer may be about 1.7 to about 1.9 and a thickness of the second inorganic layer may be about 50 nm to about 150 nm.

In an embodiment, the refractive index of the third inorganic layer may be about 1.4 to about 1.7 and a thickness of the third inorganic layer may be about 20 nm to about 50 nm.

In an embodiment, each of the first, second, and third inorganic layers may include at least one selected from a group consisting of silicon oxide ($SiO_x$), silicon nitride ($SiN_x$), and silicon oxynitride (SiON).

In an embodiment, the first inorganic layer includes silicon oxynitride, the second inorganic layer includes silicon nitride, and the third inorganic layer may include at least one selected from a group consisting of silicon oxide and silicon oxynitride.

In an embodiment, the low refractive index layer may include at least one selected from a group consisting of an inorganic material substituted with fluorine and an organic material substituted with fluorine.

In an embodiment, the low refractive index layer may further include a plurality of inorganic particles having hollows dispersed therein.

In an embodiment, each of the inorganic particles may include at least one selected from a group consisting of silica ($SiO_2$), magnesium fluoride ($MgF_2$), and iron oxide ($Fe_3O_4$).

In an embodiment, the anti-reflection layer may include a thermoset material or photocurable material.

In an embodiment, the anti-reflection layer includes may further include a light absorbing material including a pigment or a dye, which absorbs visible light.

In an embodiment, when a content of the light absorbing material is about 8 percentages by weight (wt %) to about 10 wt %, a thickness of the anti-reflection layer may be about 2,000 nm to about 4,000 nm.

In an embodiment, when a content of the light absorbing material is about 20 wt % to about 50 wt %, a thickness of the anti-reflection layer may be about 300 nm to about 1,000 nm.

In an embodiment, the plurality of layers may include a first inorganic layer disposed on the anti-reflection layer, a second inorganic layer disposed on the first inorganic layer and having a refractive index smaller than a refractive index of the first inorganic layer, and a lower refractive index layer disposed on the second inorganic layer and having a refractive index smaller than the refractive index of the second inorganic layer.

In an embodiment, the first color conversion pattern may convert light emitted from a first light emitting element of light emitting elements into light of a first color, the second color conversion pattern may convert light emitted from a second light emitting element of the light emitting elements into light of a second color, and the light transmission pattern may transmit light emitted from a third light emitting element of the light emitting elements.

In an embodiment, the first color may be red, the second color may be green, and the light emitted from the light emitting element may be blue light.

A display device according to embodiments of the present disclosure includes: a substrate including first, second, and third emitting areas and a light blocking area surrounding the first, second, and third emitting areas; light emitting elements disposed in the first, second, and third light emitting areas, respectively, on the substrate and, which emits blue light; a color conversion layer including a first color conversion pattern, which converts the blue light into red light, a second color conversion pattern, which converts the blue light into green light, and a light transmission pattern, which transmits the blue light, where the first color conversion pattern, the second color conversion pattern, and the light transmission pattern are disposed in the first, second, and third emitting areas on the light emitting elements, respectively; a light blocking layer disposed in the light blocking area on the color conversion layer, an anti-reflection layer disposed on the color conversion layer and including a light absorbing material, which absorbs visible light; and a low reflection layer disposed on the anti-reflection layer and including a plurality of inorganic layers having different refractive indices from each other, and a low refractive index layer disposed on the inorganic layers and having a smaller refractive index than the inorganic layers.

In an embodiment, the plurality of inorganic layers may include a first inorganic layer disposed on the anti-reflection layer, a second inorganic layer disposed on the first inorganic layer and having a refractive index greater than a refractive index of the first inorganic layer, and a third inorganic layer disposed on the second inorganic layer and having a refractive index smaller than a refractive index of the second inorganic layer.

A display device according to an embodiment of the present disclosure may include an anti-reflection layer absorbing visible light and a low reflection layer disposed on the anti-reflection layer and including a plurality of layers having different refractive indices. The plurality of layers may include a first inorganic layer, a second inorganic layer disposed on the first inorganic layer and having a refractive index greater than a refractive index of the first inorganic layer, a third inorganic layer disposed on the second inorganic layer and having a refractive index greater than the refractive index of the second inorganic layer, and a low refractive index layer disposed on the third inorganic layer and having a refractive index smaller than the refractive index of the third inorganic layer. Accordingly, the reflectance of the display device by external light may be effectively reduced. In addition, the display quality of the display device may be improved. In addition, the manufacturing process of the display device may be simplified, and the process cost of the display device may be effectively reduced.

BRIEF DESCRIPTION OF THE DRAWINGS

Illustrative, non-limiting embodiments will be more clearly understood from the following detailed description in conjunction with the accompanying drawings.

DETAILED DESCRIPTION

Figure 1:
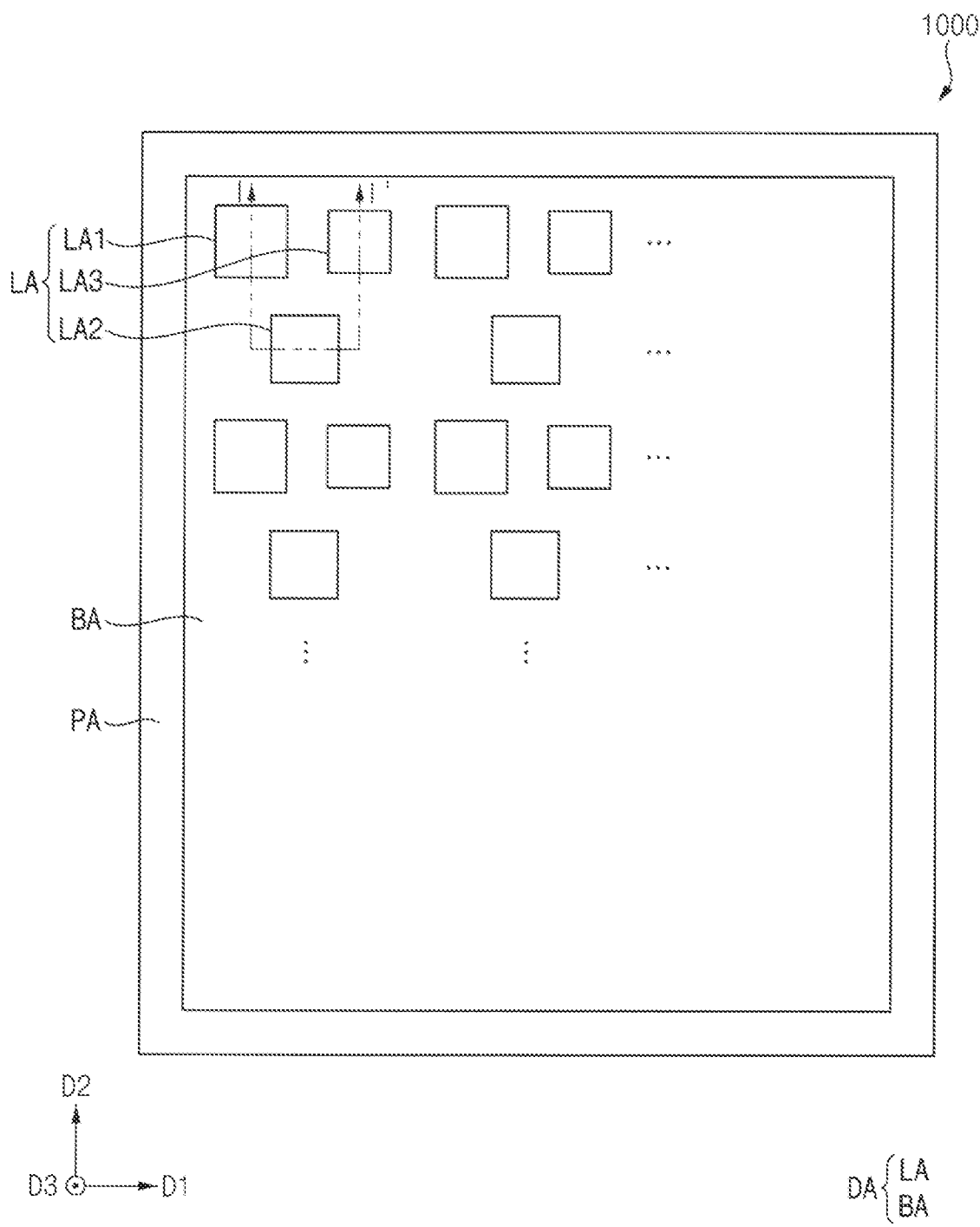
FIG. 1 is a plan view illustrating a display device according to an embodiment.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. Hereinafter, a display device according to embodiments of the present disclosure will be explained in detail with reference to the accompanying drawings. The same reference numerals are used for the same components in the drawings, and redundant descriptions of the same components will be omitted.

FIG. 1 is a plan view illustrating a display device according to an embodiment. Here, the "plan view" is a view in a third direction D3 (that is, a thickness direction of the display device or a substrate thereof).

Referring to FIG. 1, a display device 1000 according to an embodiment may include a display area DA and a peripheral area PA. The display area DA may be defined as an area for displaying an image. The peripheral area PA may be defined as an area that does not display an image. The peripheral area PA may be located around the display area DA. For example, the peripheral area PA may surround an entirety of the display area DA.

The display area DA may include a plurality of light emitting areas LA and a light blocking area BA. Each of the plurality of light emitting areas LA may include a first light-emitting area LA1, a second light emitting area LA2, and a third light emitting area LA3.

Each of the first, second, and third light emitting areas LA1, LA2, and LA3 may be an area in which light emitted from a light emitting element is emitted to an outside of the display device 1000. For example, the first light emitting area LA1 may emit a first light, the second light emitting area LA2 may emit a second light, and the third light emitting area LA3 may emit a third light. In an embodiment, the first light may be red light, the second light may be green light, and the third light may be blue light. However, the present disclosure is not limited thereto, and for example, the first, second, and third light emitting areas LA1, LA2, and LA3 are combined to emit yellow, cyan, and magenta lights in another embodiment.

Each of the first, second, and third light emitting areas LA1, LA2, and LA3 may be repeatedly arranged along a row direction and a column direction in a plan view. Specifically, each of the first, second, and third light emitting areas LA1, LA2, and LA3 may be repeatedly arranged in the first direction D1 and in the second direction D2 orthogonal to the first direction D1. For example, the first light emitting area LA1 and the third light emitting area LA3 are alternately arranged along the first direction D1 in odd numbered rows (e.g., a first row) of the display area DA, and the second light emitting area LA2 may be repeatedly arranged along the first direction D1 in even-numbered row (e.g., a second row) adjacent to the odd-numbered row of the display area DA.

Areas of the first, second, and third light emitting areas LA1, LA2, and LA3 may be different from each other. In an embodiment, the area of the first light emitting area LA1 emitting red light may be larger than the area of each of the second light emitting area LA2 emitting green light and the third light emitting area LA3 emitting blue light. In this case, the area of the second light emitting area LA2 may be larger than the area of the third light emitting area LA3. However, the configuration of the present disclosure is not limited thereto. For example, the area of the second light emitting area LA2 emitting green light may be larger than the area of each of the first light emitting area LA1 emitting red light and the third light emitting area LA3 emitting blue light in another embodiment. In this case, the area of the first light emitting area LA1 may be larger than the area of the third light emitting area LA3.

Each of the first, second, and third light emitting areas LA1, LA2, and LA3 may have a triangular planar shape, a rectangular planar shape, a circular planar shape, a track-type planar shape, an elliptical planar shape, or the like. In an embodiment, each of the first, second, and third light emitting areas LA1, LA2, and LA3 may have a rectangular planar shape.

The light blocking area BA may be located between the first, second, and third light emitting areas LA1, LA2, and LA3. For example, the light blocking area BA may surround the first, second, and third light emitting areas LA1, LA2, and LA3 in a plan view. The light blocking area BA may not emit light.

Figure 2:
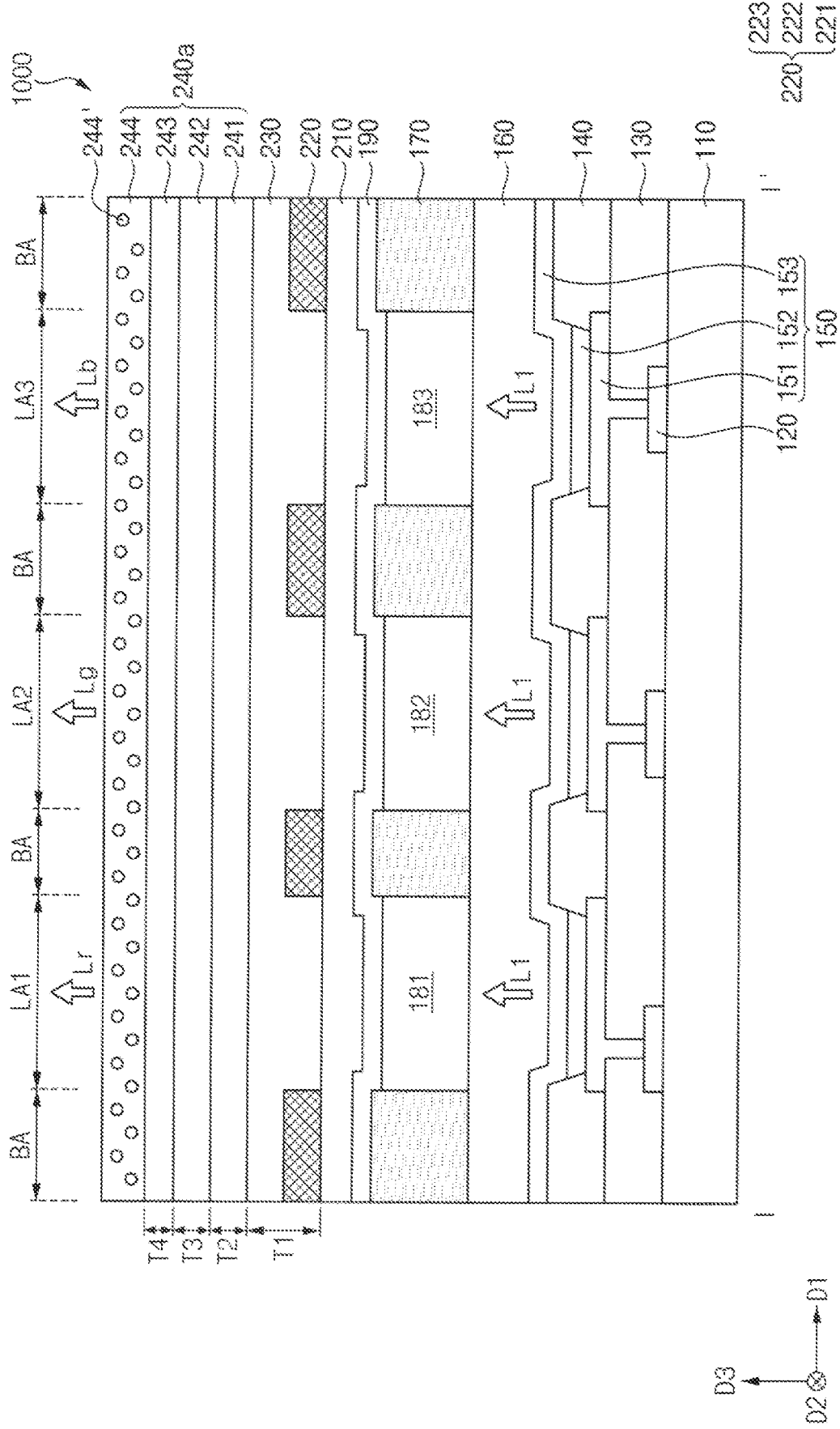
FIG. 2 is a cross-sectional view taken along line I-I' of FIG. 1.

FIG. 2 is a cross-sectional view taken along line I-I' of FIG. 1.

Referring to FIG. 2, the display device 1000 according to an embodiment may include a substrate 110, a driving element 120, an insulating structure 130, a pixel-defining layer 140, a light emitting element 150, an encapsulation structure 160, a bank layer 170, a color conversion layer 180, a capping layer 190, a low refractive index layer 210, a light blocking layer 220, an anti-reflection layer 230 and a low reflection layer 240a.

Here, the light emitting element 150 may include a lower electrode 151, a light emitting layer 152, and an upper electrode 153. The color conversion layer 180 may include a first color conversion pattern 181, a second color conversion pattern 182, and a light transmission pattern 183. The low reflection layer 240a may include a first inorganic layer 241, a second inorganic layer 242, a third inorganic layer 243, and a low refractive index layer 244.

The substrate 110 may include a transparent material or an opaque material. The substrate 110 may be formed of or include a transparent resin substrate. A polyimide substrate and the like are mentioned as an example of the said transparent resin substrate. In this case, the polyimide substrate may include a first organic layer, a first barrier layer, a second organic layer, or the like. Alternatively, the substrate 110 may include a quartz substrate, a synthetic quartz substrate, a calcium fluoride substrate, a fluorine-doped quartz substrate, a soda-lime glass substrate, a non-alkali glass substrate, or the like. These may be used alone or in combination with each other.

The driving element 120 may be disposed on the substrate 110. In an embodiment, the driving element 120 may include a thin film transistor. For example, the driving element 120 may include amorphous silicon, polycrystalline silicon, or a metal oxide semiconductor.

The metal oxide semiconductor may include a binary compound ("$AB_x$"), a ternary compound ("$AB_xC_y$"), a quaternary compound ("$AB_xC_yD_z$"), or the like containing indium ("In"), zinc ("Zn"), gallium ("Ga"), tin ("Sn"), titanium ("Ti"), aluminum ("Al"), hafnium ("Hf"), zirconium ("Zr"), magnesium ("Mg"), or the like. For example, the metal oxide semiconductor may include zinc oxide ("$ZnO_x$"), gallium oxide ("$GaO_x$"), tin oxide ("$SnO_x$"), indium oxide ("$InO_x$"), indium gallium oxide ("IGO"), indium zinc oxide ("IZO"), and indium tin oxide ("ITO"), indium zinc tin oxide ("IZTO"), indium gallium zinc oxide ("IGZO"), or the like. These may be used alone or in combination with each other.

The insulating structure 130 may be disposed on the substrate 110. The insulating structure 130 may cover the driving element 120. The insulating structure 130 may include a combination of at least one inorganic insulating layer and at least one organic insulating layer. For example, the inorganic insulating layer may include silicon oxide ("SiOx"), silicon nitride ("$SiN_x$"), silicon carbide ("$SiC_x$"), silicon oxynitride ("$SiO_xN_y$"), silicon oxycarbide ("$SiO_xC_y$"), or the like. In addition, the organic insulating layer includes a photoresist, a polyacryl-based resin, a polyimide-based resin, a polyamide-based resin, and a siloxane-based resin, an acryl-based resin, an epoxy-based resin, or the like. Each of these may be used alone or in combination with each other.

The lower electrode 151 may be disposed in each of the first, second, and third light emitting areas LA1, LA2, and LA3 on the insulating structure 130. The lower electrode 151 may be connected to the driving element 120 through a contact hole formed by removing a portion of the insulating structure 130. For example, the lower electrode 151 may include a metal, an alloy, a metal nitride, a conductive metal oxide, a transparent conductive material, or the like. These may be used alone or in combination with each other. For example, the lower electrode 151 may act as an anode.

The pixel-defining layer 140 may be disposed in the light blocking area BA on the insulating structure 130 and the lower electrode 151. The pixel-defining layer 140 may cover both sides of the lower electrode 151 and expose an upper surface of the lower electrode 151. The pixel-defining layer 140 may include an organic material or an inorganic material. In an embodiment, the pixel-defining layer 140 may include an organic material. Examples of the organic material that can be used for the pixel-defining layer 140 may include photoresist, polyacrylic resin, polyimide-based resin, polyamide-based resin, siloxane-based resin, acrylic-based resin, epoxy-based resin, or the like. These may be used alone or in combination with each other.

The light emitting layer 152 may be disposed on the lower electrode 151. For example, hole provided from the lower electrode 151 and electron provided from the upper electrode 153 combine in the light emitting layer 152 to form exciton, and as the exciton changes from an excited state to a ground state, the light emitting layer 152 may emit light. The light emitting layer 152 may emit light having a specific color (e.g., red, green, and blue). In an embodiment, the light emitting layer 152 may emit blue light L1.

The upper electrode 153 may be disposed on the light emitting layer 152 and the pixel-defining layer 140. The upper electrode 153 may be disposed in an entirety of the first, second, and third light emitting areas LA1, LA2, and LA3 and the light blocking area BA. For example, the upper electrode 153 may include a metal, an alloy, a metal nitride, a conductive metal oxide, a transparent conductive material, or the like. These may be used alone or in combination with each other. For example, the upper electrode 153 may act as a cathode.

Accordingly, the light emitting element 150 including the lower electrode 151, the light emitting layer 152, and the upper electrode 153 may be disposed on the substrate 110. The light emitting element 150 may be disposed in each of the first light emitting area LA1, the second light emitting area LA2, and the third light emitting area LA3. The light emitting element 150 may be electrically connected to the driving element 120. In an embodiment, the light emitting element 150 may include a blue light emitting element emitting blue light L1.

The encapsulation structure 160 may be disposed on the upper electrode 153. The encapsulation structure 160 may prevent impurities, moisture, or the like from penetrating into the light emitting element 150 from the outside. The encapsulation structure 160 may include at least one inorganic encapsulation layer and at least one organic encapsulation layer. For example, the inorganic encapsulation layer may include silicon oxide, silicon nitride, silicon oxynitride, or the like. These may be used alone or in combination with each other. The organic encapsulation layer may include a cured polymer such as polyacrylate.

The bank layer 170 may be disposed on the encapsulation structure 160. The bank layer 170 may overlap the light blocking area BA in a plan view. The bank layer 170 may surround the color conversion layer 180. A space for accommodating an ink composition may be formed in the bank layer 170 in the process of forming the color conversion layer 180. Accordingly, the bank layer 170 may have a grid shape or a matrix shape in a plan view.

For example, the bank layer 170 may include an organic material such as an epoxy-based resin, a phenolic resin, an acrylic-based resin, a silicone-based resin, or the like. These may be used alone or in combination with each other.

In an embodiment, the bank layer 170 may further include a light blocking material to serve as a black matrix. For example, at least a portion of the bank layer 170 may further include a light blocking material such as a pigment, a dye, or carbon black.

The color conversion layer 180 may be disposed on the encapsulation structure 160. The color conversion layer 180 may convert light emitted from the light emitting element 150 into light having a specific wavelength.

As described above, the color conversion layer 180 may include the first color conversion pattern 181, the second color conversion pattern 182, and the light transmission pattern 183. The first color conversion pattern 181 may overlap the first light emitting area LA1, the second color conversion pattern 182 may overlap the second light emitting area LA2, and the light transmission pattern 183 may overlap the third light emitting area LA3 in a plan view.

The first color conversion pattern 181 may convert light L1 (e.g., blue light) emitted from the light emitting element 150 into light Lr of a first color. The second color conversion pattern 182 may convert the light L1 emitted from the light emitting element 150 into light Lg of a second color. The light transmission pattern 183 may transmit the light L1 emitted from the light emitting element 150. In an embodiment, the first color may be red, and the second color may be green. In addition, the light transmission pattern 183 may transmit the blue light Lb. However, the present invention is not limited thereto.

Figure 3:
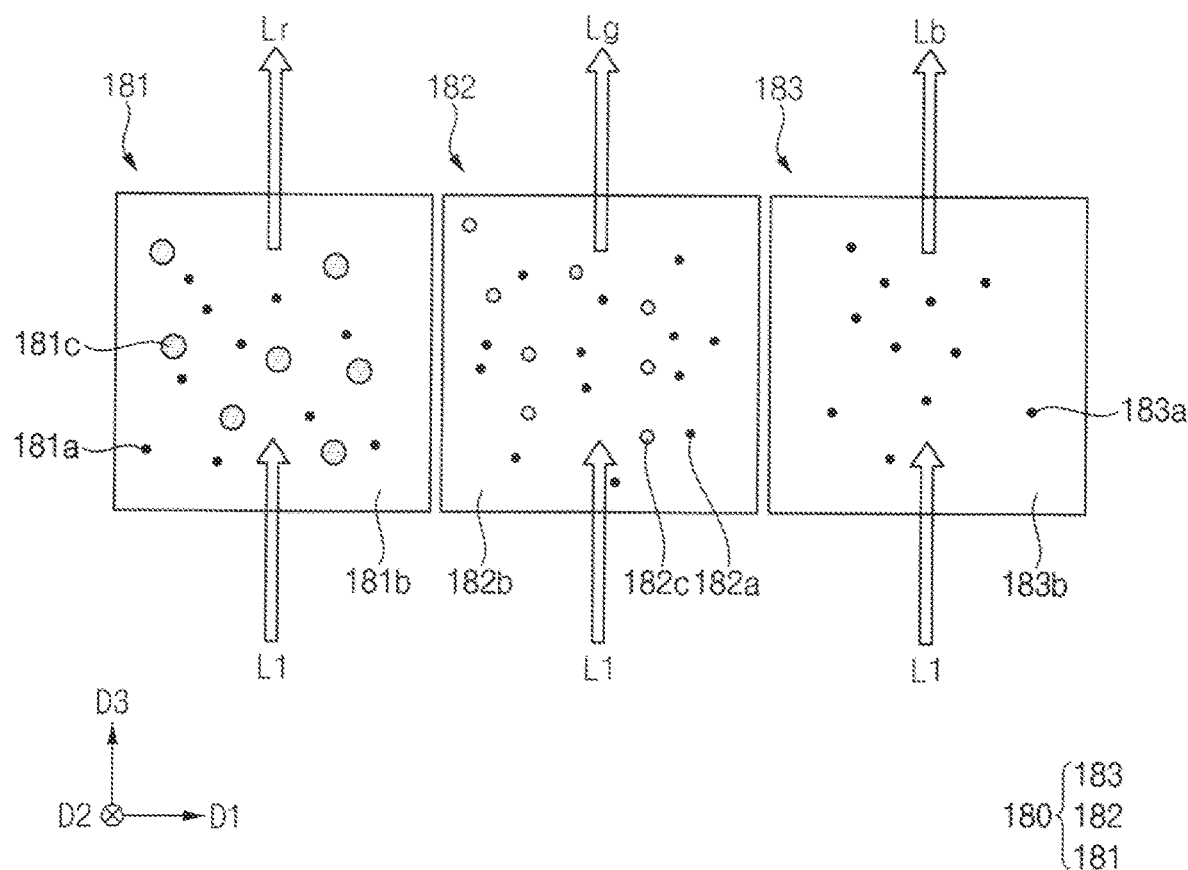
FIG. 3 is a cross-sectional view illustrating a color conversion layer of the display device of FIG. 2.

FIG. 3 is a cross-sectional view illustrating a color conversion layer of the display device of FIG. 2.

Referring to FIGS. 2 and 3, the first color conversion pattern 181 may include first quantum dots 181c that are excited by the light L1 emitted from the light emitting element 150 and emit the light Lr of the first color. In addition, the first color conversion pattern 181 may further include a first photosensitive polymer 181b in which the first scattering particles 181a are dispersed.

The second color conversion pattern 182 may include second quantum dots 182c that are excited by the light L1 emitted from the light emitting element 150 and emit the light Lg of the second color. In addition, the second color conversion pattern 182 may further include a second photosensitive polymer 182b in which the second scattering particles 182a are dispersed.

The light transmission pattern 183 may transmit the light L1 emitted from the light emitting element 150 to emit blue light Lb. In addition, the light transmission pattern 183 may include a third photosensitive polymer 183b in which the third scattering particles 183a are dispersed.

For example, each of the first, second, and third photosensitive polymers 181b, 182b, and 183b may include an organic material having light transmittance such as a silicone resin, an epoxy resin, or the like. The first, second, and third scattering particles 181a, 182a, and 183a may scatter and emit light emitted from the light emitting element 150. In addition, the first, second, and third scattering particles 181a, 182a, and 183a may include the same material.

Accordingly, the first light emitting area LA1 may emit the red light Lr, the second light emitting area LA2 may emit the green light Lg, and the third light emitting area LA3 may emit the blue light Lb.

Referring back to FIG. 2, the capping layer 190 may be disposed on the bank layer 170 and the color conversion layer 180. The capping layer 190 may be disposed in an entirety of the first, second, and third light emitting areas LA1, LA2, and LA3 and the light blocking area BA. The capping layer 190 may serve to prevent moisture permeation to prevent deterioration of the color conversion layer 180.

In an embodiment, the capping layer 190 may be disposed along a profile of each of the bank layer 170 and the color conversion layer 180. That is, the capping layer 190 may have a substantially uniform thickness along the profile of each of the bank layer 170 and the color conversion layer 180. In another embodiment, the capping layer 190 may sufficiently cover the bank layer 170 and the color conversion layer 180, and may have a substantially a flat upper surface without forming a step around the bank layer 170 and the color conversion layer 180.

The capping layer 190 may include a silicon compound. For example, the capping layer 190 may include silicon oxide, silicon nitride, silicon oxynitride, or the like. These may be used alone or in combination with each other.

The low refractive index layer 210 may be disposed on the capping layer 190. The low refractive index layer 210 may be disposed in an entirety of the first, second, and third light emitting areas LA1, LA2, and LA3 and the light blocking area BA. The low refractive index layer 210 may have a relatively low refractive index. For example, the refractive index of the low refractive index layer 210 may be lower than a refractive index of the color conversion layer 180. The low refractive index layer 210 may include an organic material. For example, the low refractive index layer 210 may include an organic polymer material including silicon.

The light blocking layer 220 may be disposed on the low refractive index layer 210. The light blocking layer 220 may overlap the light blocking area BA in a plan view. The light blocking layer 220 may prevent debt leakage. The light blocking layer 220 may include an organic material and/or an inorganic material. For example, the light blocking layer 220 may include an organic material such as an epoxy resin, a phenol resin, an acrylic resin, a silicone resin, or the like. These may be used alone or in combination with each other. In addition, the light blocking layer 220 may further include a light blocking material such as black pigment, black dye, or carbon black. In an embodiment, the light blocking layer 220 may be a black matrix.

The anti-reflection layer 230 may be disposed on the low refractive index layer 210. The anti-reflection layer 230 may be disposed in an entirety of the first, second, and third light emitting areas LA1, LA2, and LA3 and the light blocking area BA. The anti-reflection layer 230 may sufficiently cover the light blocking layer 220. The anti-reflection layer 230 may perform a surface planarization function and may protect the driving element 120, the light emitting element 150, or the like from penetration of external air. In addition, the anti-reflection layer 230 may reduce the reflectance of the display device 1000 due to external light.

The anti-reflection layer 230 may include an inorganic material and/or an organic material. For example, the anti-reflection layer 230 may include an acrylic-based resin, a methacrylic-based resin, a vinyl-based resin, an epoxy-based resin, a urethane-based resin, a cellulose-based resin, a perylene-based resin, a silsesquioxane-based resin (e.g., a polyhedral oligomeric silsesquioxane, POSS), or the like. These may be used alone or in combination with each other. That is, the anti-reflection layer 230 may include a thermoset material or a photocurable material.

The anti-reflection layer 230 may further include a light absorbing material that absorbs visible light. The light absorbing material may include a dye and/or a pigment. For example, the pigment may include an organic pigment, a red pigment, a green pigment, a blue pigment, or the like. In addition, the dye may include an organic dye, a red dye, a green dye, a blue dye, or the like. Each of these may be used alone or in combination with each other. Accordingly, the anti-reflection layer 230 may have a gray color.

Here, the organic pigment may be a known pigment formed of or include an organic material and commonly used among pigments having a black color. In addition, the red pigment, the green pigment, and the blue pigment may be known pigments commonly used among pigments having red, green, and blue colors, respectively. For example, C.I. pigment red-based pigment may be used as the red pigment, C.I. pigment green-based pigment may be used as the green pigment, and a phthalocyanine-based pigment or indanthrone blue pigment may be used as the blue pigment.

In an embodiment, when a content of the light absorbing material is about 8 percentages by weight (wt %) to about 10 wt %, a thickness T1 of the anti-reflection layer 230 may be about 2,000 nm to about 4,000 nm. When the content of the light absorbing material is about 8 wt % to about 10 wt %, and the thickness T1 of the anti-reflection layer 230 is less than about 2,000 nm or more than about 4,000 nm, the reflectance of the display device 1000 due to external light may increase.

In an embodiment, when the content of the light absorbing material is about 20 wt % to about 50 wt %, the thickness T1 of the anti-reflection layer 230 may be about 300 nm to about 1,000 nm. When the content of the light absorbing material is less than about 20 wt % or more than about 50 wt %, the reflectance of the display device 1000 by external light may increase.

The low reflection layer 240a may be disposed on the anti-reflection layer 230. The low reflection layer 240a may be disposed in an entirety of the first, second, and third light emitting areas LA1, LA2, and LA3 and the light blocking area BA. The low reflection layer 240a may include a plurality of layers. In an embodiment, the number of the plurality of layers may be three or four. Hereinafter, a case in which the number of the plurality of layers is four will be described as an example.

As described above, the low reflection layer 240a may include the first inorganic layer 241, the second inorganic layer 242, the third inorganic layer 243, and the low refractive index layer 244. The low reflection layer 240a may reduce the reflectance of external light incident on the anti-reflection layer 230.

The first inorganic layer 241, the second inorganic layer 242, the third inorganic layer 243, and the low refractive index layer 244 may be sequentially disposed. That is, the second inorganic layer 242 may be disposed on the first inorganic layer 241, the third inorganic layer 243 may be disposed on the second inorganic layer 242, and the low refractive index layer 244 may be disposed on the third inorganic layer 243.

Each of the first, second, and third inorganic layers 241, 242, and 243 may include a silicon compound. For example, each of the first, second, and third inorganic layers 241, 242, and 243 may include silicon oxide, silicon nitride, silicon oxynitride, or the like. These may be used alone or in combination with each other. In an embodiment, the first inorganic layer 241 may include silicon oxynitride, the second inorganic layer 242 may include silicon nitride, and the third inorganic layer 243 may include silicon oxynitride or silicon oxide.

The low refractive index layer 244 may include an organic material and/or an inorganic material. In an embodiment, the low refractive index layer 244 may include an organic material substituted with fluorine and/or an inorganic material substituted with fluorine. For example, the low refractive index layer 244 may include fluorinated-polysiloxane, fluorinated-polyurethane-acrylate, fluorinated-polyhedral oligomeric silsesquioxane, or the like. These may be used alone or in combination with each other.

The low refractive index layer 244 may further include a plurality of inorganic particles 244' having hollows dispersed therein. For example, each of the inorganic particles 244' may include silica ($SiO_2$), magnesium fluoride ($MgF_2$), iron oxide ($Fe_3O_4$), or the like. These may be used alone or in combination with each other.

The refractive index of the first inorganic layer 241 may be equal to or smaller than the refractive index of the second inorganic layer 242. In an embodiment, the refractive index of the first inorganic layer 241 may be about 1.6 to about 1.7. In addition, the refractive index of the second inorganic layer 242 may be about 1.7 to about 1.9.

The refractive index of the third inorganic layer 243 may be equal to or smaller than the refractive index of the second inorganic layer 242. In addition, the refractive index of the third inorganic layer 243 may be greater than the refractive index of the low refractive index layer 244. In an embodiment, the refractive index of the third inorganic layer 243 may be about 1.4 to about 1.7. In addition, the refractive index of the low refractive index layer 244 may be about 1.25 to about 1.39.

The thickness range of a thickness T2 of the first inorganic layer 241 may be the same as the thickness range of a thickness T3 of the second inorganic layer 242. In an embodiment, the thickness T2 of the first inorganic layer 241 may be about 50 nm to about 150 nm, and the thickness T3 of the second inorganic layer 242 may be about 50 nm to about 150 nm.

A thickness T4 of the third inorganic layer 243 may be less than or equal to each of the thicknesses T2 and T3 of the first inorganic layer 241 and the second inorganic layer 242. In an embodiment, the thickness T4 of the third inorganic layer 243 may be about 20 nm to about 50 nm.

In a comparative example, a display device including a color conversion layer may include a color filter disposed on the color conversion layer and for selectively transmitting light, and an anti-reflection ("AR") film disposed on the color filter. In this case, the reflectance of the display device by external light may be relatively high. In addition, the manufacturing process of the display device may be complicated and the process cost may be high.

Although an organic light emitting display device ("OLED") is limitedly described for the display device 1000 of the present disclosure, the configuration of the present disclosure is not limited thereto. In other embodiments, the display device 1000 may include a liquid crystal display device ("LCD"), a field emission display device ("FED"), a plasma display device ("PDP"), an electrophoretic display device ("EPD"), a quantum dot display device, or an inorganic light emitting display device.

The display device 1000 according to an embodiment of the present disclosure may include the anti-reflection layer 230 for absorbing visible light and the low reflection layer 240a disposed on the anti-reflection layer 230 and including a plurality of layers having different refractive indices from each other. The plurality of layers may include the first inorganic layer 241, the second inorganic layer 242 disposed on the first inorganic layer 241 and having the refractive index greater than the refractive index of the first inorganic layer 241, the third inorganic layer 243 disposed on the second inorganic layer 242 and having the refractive index smaller than the refractive index of the second inorganic layer 242, and the low refractive index layer 244 disposed on the third inorganic layer 243 and having the refractive index smaller than the refractive index of the third inorganic layer 243. Accordingly, the reflectance of the display device 1000 by external light may be effectively reduced. In addition, the display quality of the display device 1000 may be effectively improved. In addition, the manufacturing process of the display device 1000 may be simplified, and the process cost of the display device 1000 may be effectively reduced.

FIGS. 4, 5, 6, 7, 8, 9, 10, and 11 are cross-sectional views illustrating a method of manufacturing the display device of FIG. 2.

Figure 4:
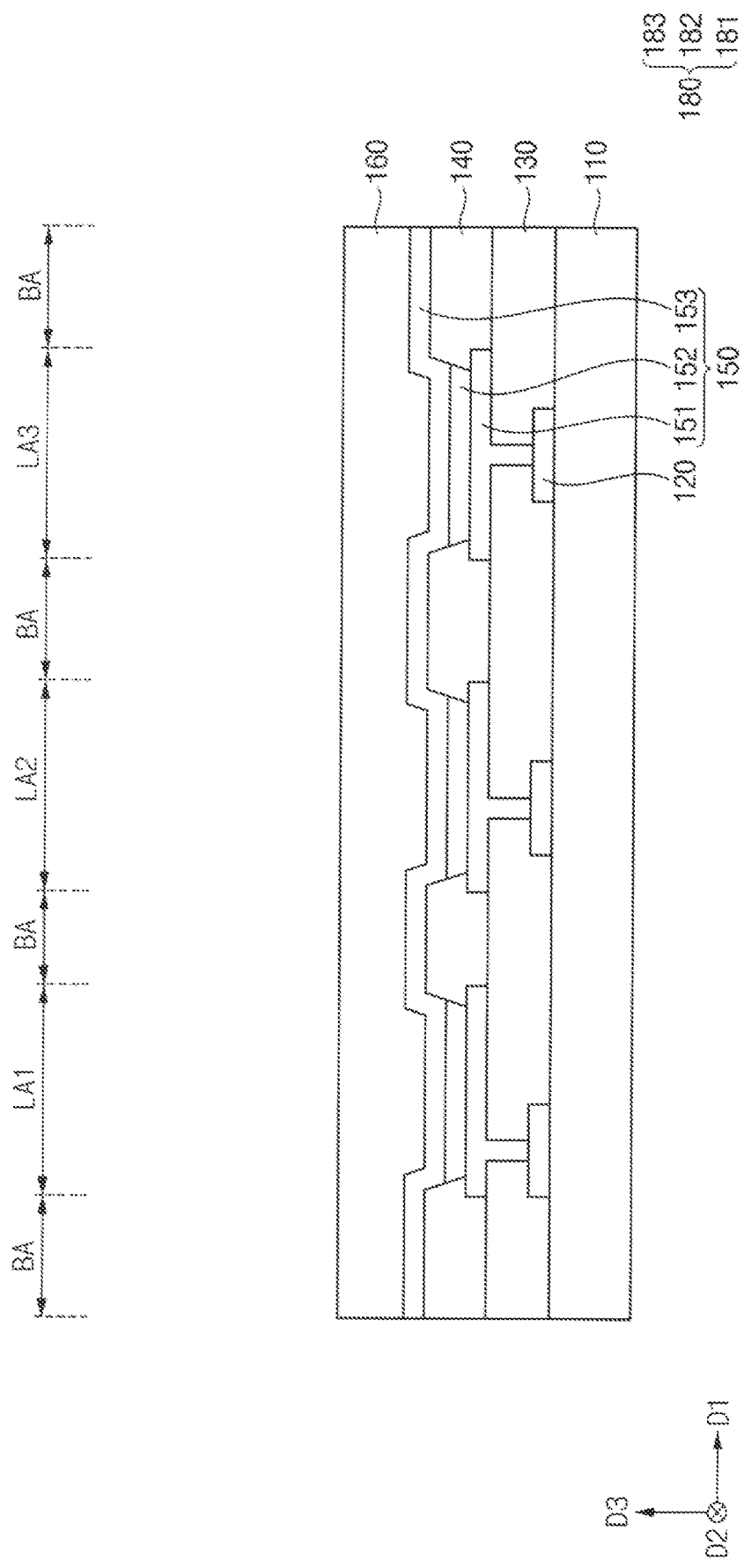
FIGS. 4, 5, 6, 7, 8, 9, 10, and 11 are cross-sectional views illustrating a method of manufacturing the display device of FIG. 2.

Referring to FIG. 4, the substrate 110 including a transparent material or an opaque material may be provided. The driving element 120 may be formed on the substrate 110. For example, the driving element 120 may be formed using amorphous silicon, crystalline silicon, or a metal oxide semiconductor.

The insulating structure 130 may be formed on the substrate 110. The insulating structure 130 may be formed in an entirety of the first, second, and third light emitting areas LA1, LA2, and LA3 and the light blocking area BA. The insulating structure 130 may cover the driving element 120. For example, the insulating structure 130 may include at least one inorganic insulating layer and at least one organic insulating layer.

The lower electrode 151 may be formed in each of the first, second, and third light emitting areas LA1, LA2, and LA3 on the insulating structure 130. The lower electrode 151 may be connected to the driving element 120 through a contact hole formed by removing a portion of the insulating structure 130. For example, the lower electrode 151 may be formed using a metal, an alloy, a metal nitride, a conductive metal oxide, a transparent conductive material, or the like.

The pixel-defining layer 140 may be formed in the light blocking area BA on the insulating structure 130 and the lower electrode 151. The pixel-defining layer 140 may have an opening exposing a portion of the upper surface of the lower electrode 151. For example, the pixel-defining layer 140 may be formed using an organic material or an inorganic material.

The light emitting layer 152 may be formed on the lower electrode 151. Specifically, the light emitting layer 152 may be formed inside the opening of the pixel-defining layer 140. For example, the light emitting layer 152 may be formed using a low molecular weight organic compound or a high molecular weight organic compound.

The upper electrode 153 may be formed on the light emitting layer 152 and the pixel-defining layer 140. The upper electrode 153 may be formed in an entirety of the first, second, and third light emitting areas LA1, LA2, and LA3 and the light blocking area BA. For example, the upper electrode 153 may be formed using a metal, an alloy, a metal nitride, a conductive metal oxide, a transparent conductive material, or the like.

Accordingly, the light emitting element 150 including the lower electrode 151, the light emitting layer 152, and the upper electrode 153 may be disposed in each of the first, second, and third light emitting areas LA1, LA2, and LA3 on the substrate 110.

The encapsulation structure 160 may be formed on the upper electrode 153. The encapsulation structure 160 may be formed in an entirety of the first, second, and third light emitting areas LA1, LA2, and LA3 and the light blocking area BA. For example, the encapsulation structure 160 may include at least one inorganic encapsulation layer and at least one organic encapsulation layer.

Figure 5:
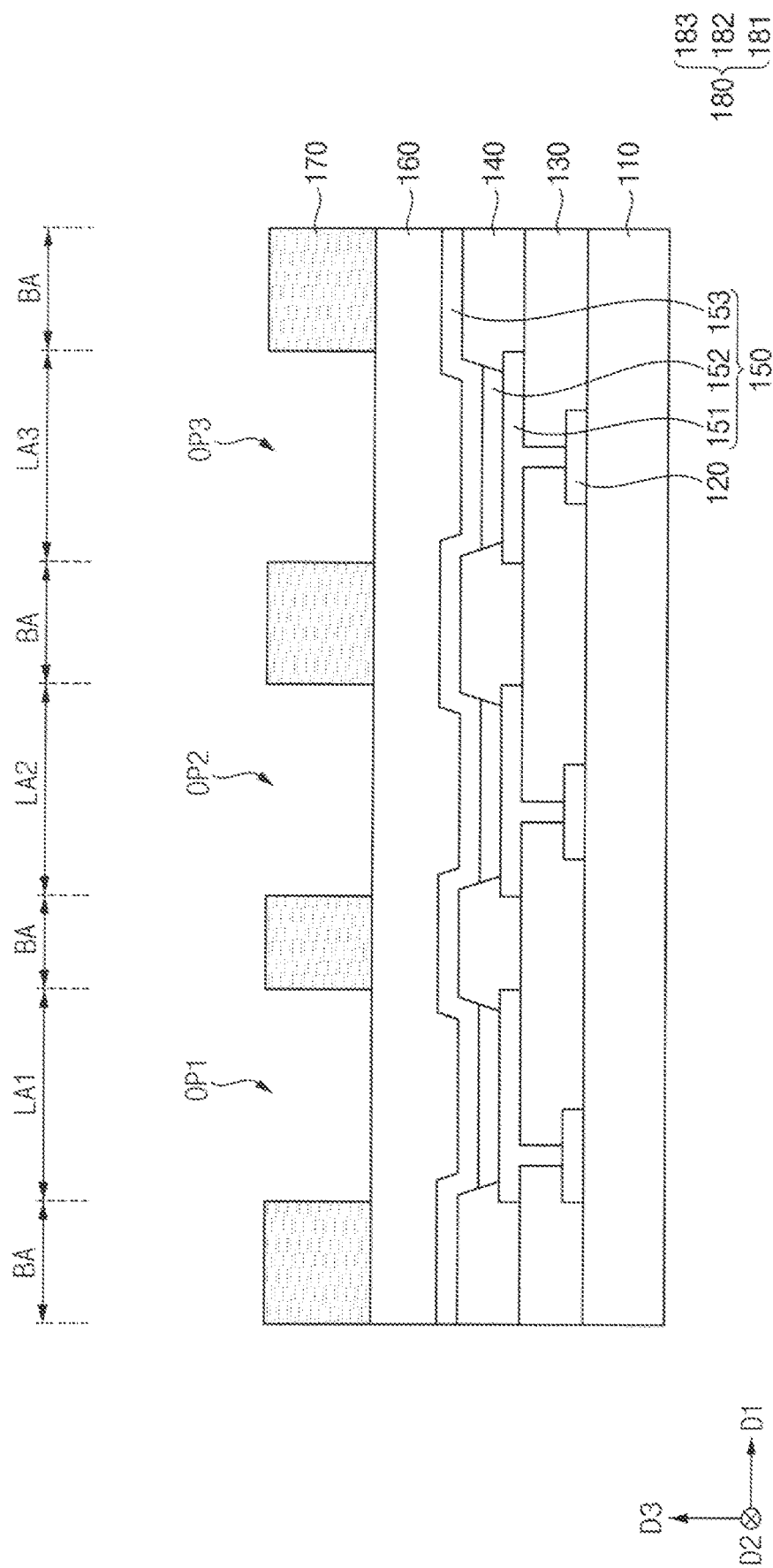

Referring to FIG. 5, the bank layer 170 may be formed on the encapsulation structure 160. Specifically, the bank layer 170 may be formed to overlap the light blocking area BA in a plan view. For example, the bank layer 170 may be formed using an organic material or the like.

The bank layer 170 may have a first opening area OP1, a second opening area OP2, and a third opening area OP3. The first opening area OP1 may overlap the first light emitting area LA1, the second opening area OP2 may overlap the second light emitting area LA2, and the third opening area OP3 may overlap the third light emitting area LA3 in a plan view. Each of the first, second, and third opening regions OP1, OP2, and OP3 may receive an ink composition in the process of forming the color conversion layer (e.g., the color conversion layer 180 of FIG. 7).

Figure 6:
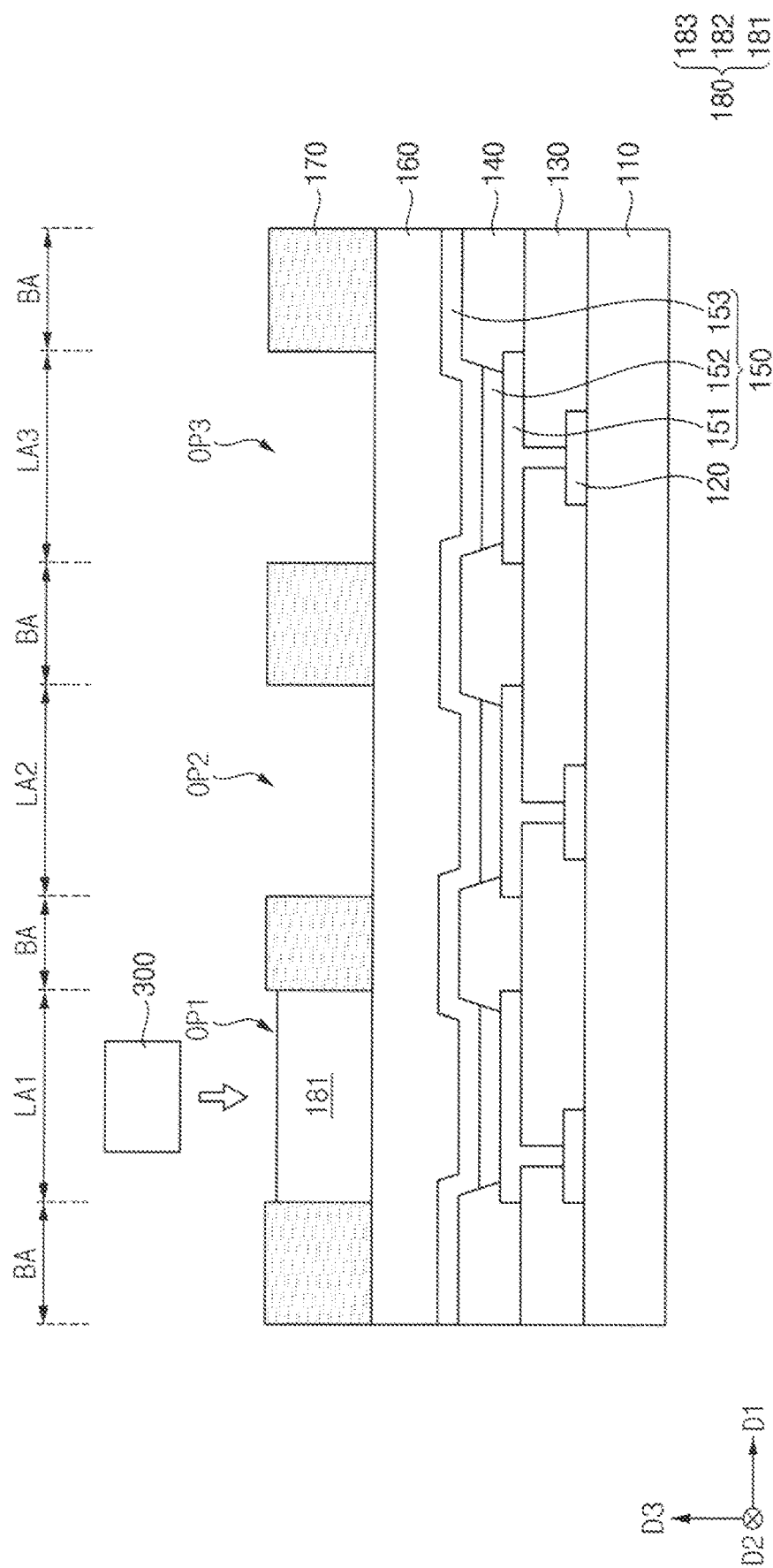
Figure 7:
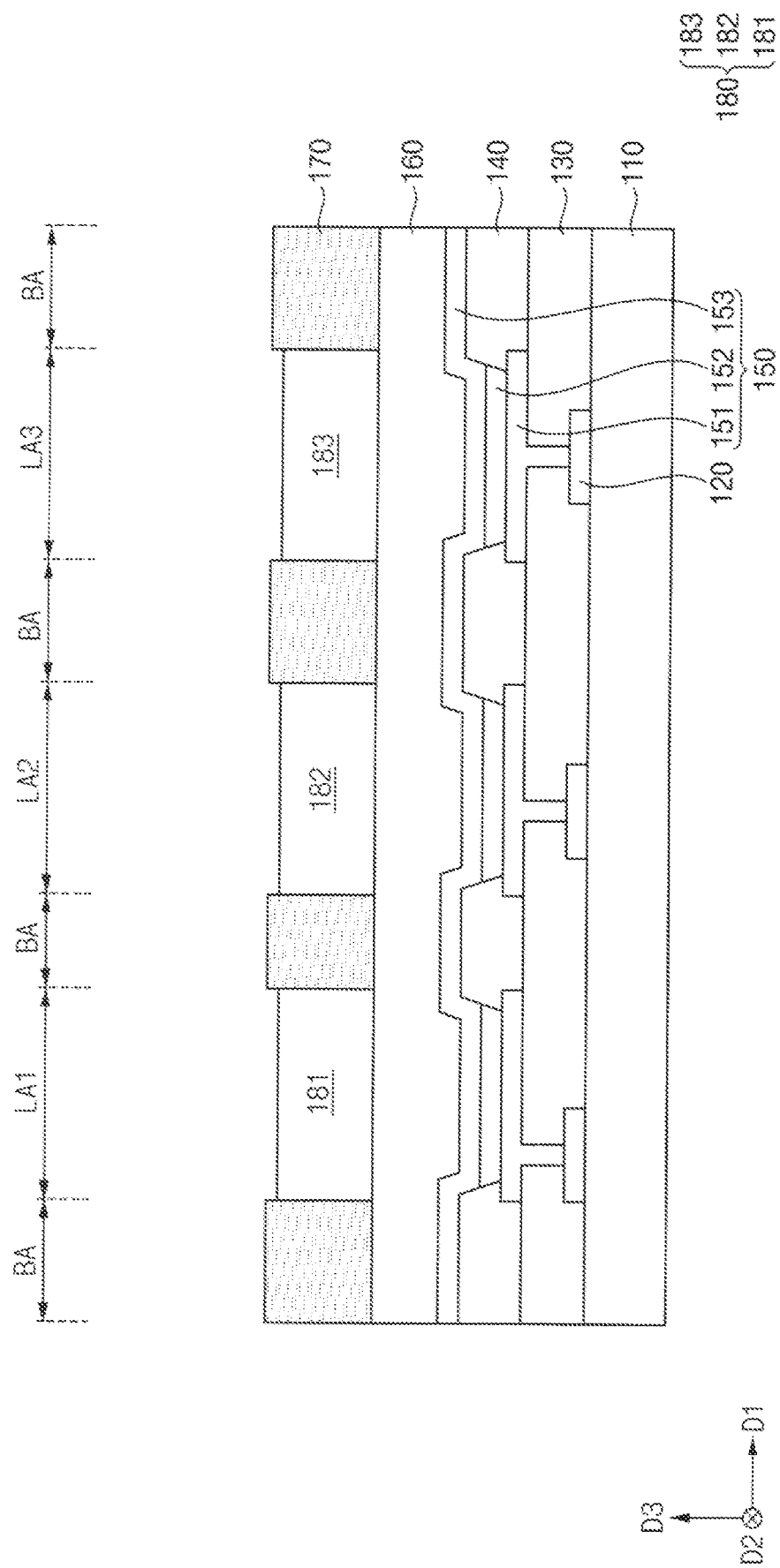

Referring to FIGS. 6 and 7, an inkjet apparatus 300 may drop the ink composition onto the first opening area OP1. Here, the ink composition may be a material forming the color conversion layer.

The inkjet apparatus 300 may repeatedly drop the ink composition onto the first opening area OP1 to form the first color conversion pattern 181. In addition, the inkjet apparatus 300 may repeatedly drop the ink composition onto the second opening area OP2 to form the second color conversion pattern 182. In addition, the inkjet apparatus 300 may repeatedly drop the ink composition onto the third opening area OP3 to form the light transmission pattern 183. Accordingly, the color conversion layer 180 including the first color conversion pattern 181, the second color conversion pattern 182, and the light transmission pattern 183 may be formed on the encapsulation structure 160.

Figure 8:
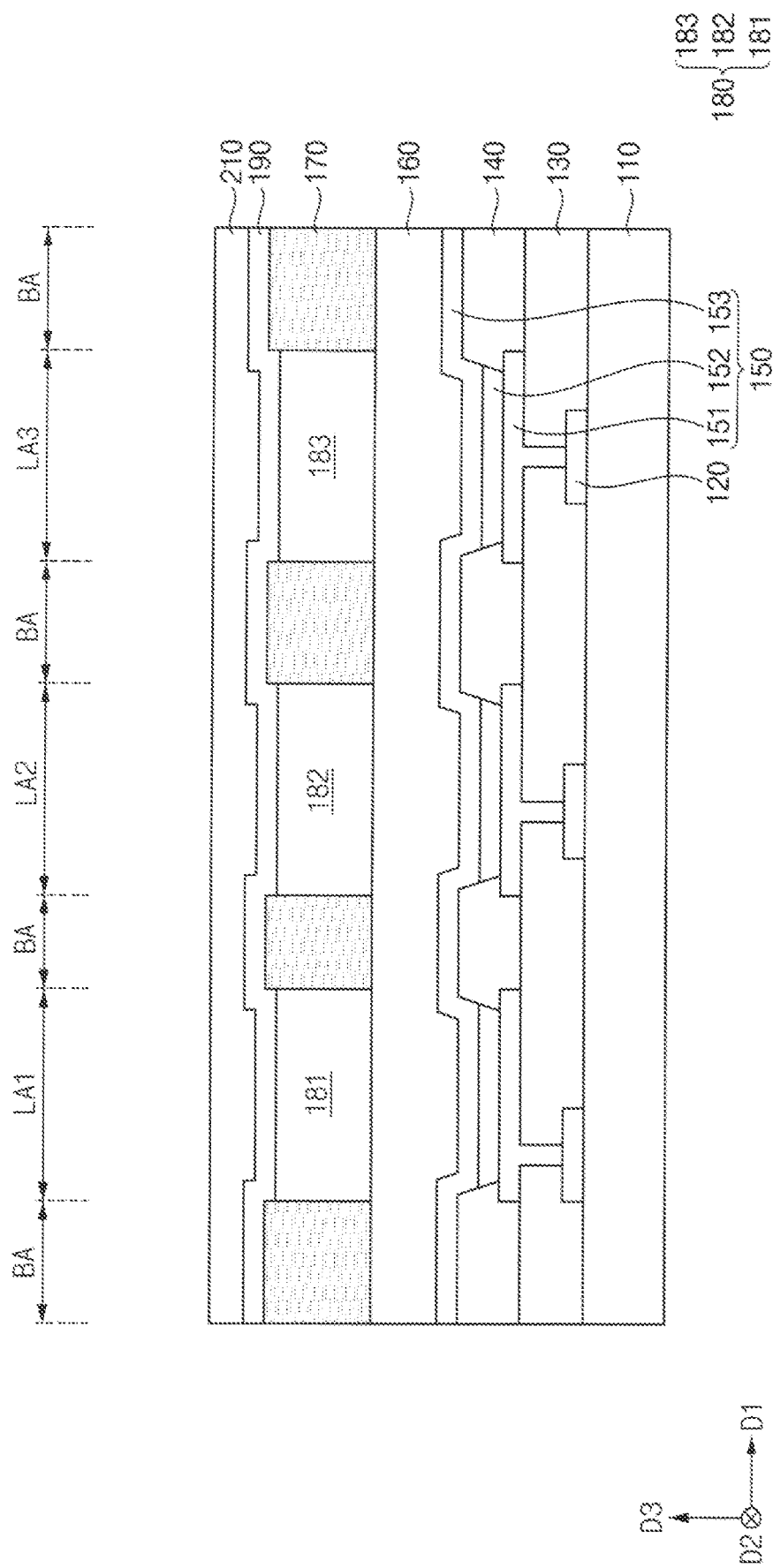

Referring to FIG. 8, the capping layer 190 may be formed on the color conversion layer 180 and the bank layer 170. The capping layer 190 may be formed in an entirety of the first, second, and third light emitting areas LA1, LA2, and LA3 and the light blocking area BA. For example, the capping layer 190 may be formed using silicon oxide, silicon nitride, silicon oxynitride, or the like.

The low refractive index layer 210 may be formed on the capping layer 190. The low refractive index layer 210 may be formed in an entirety of the first, second, and third light emitting areas LA1, LA2, and LA3 and the light blocking area BA. For example, the low refractive index layer 210 may be formed using an organic material.

Figure 9:
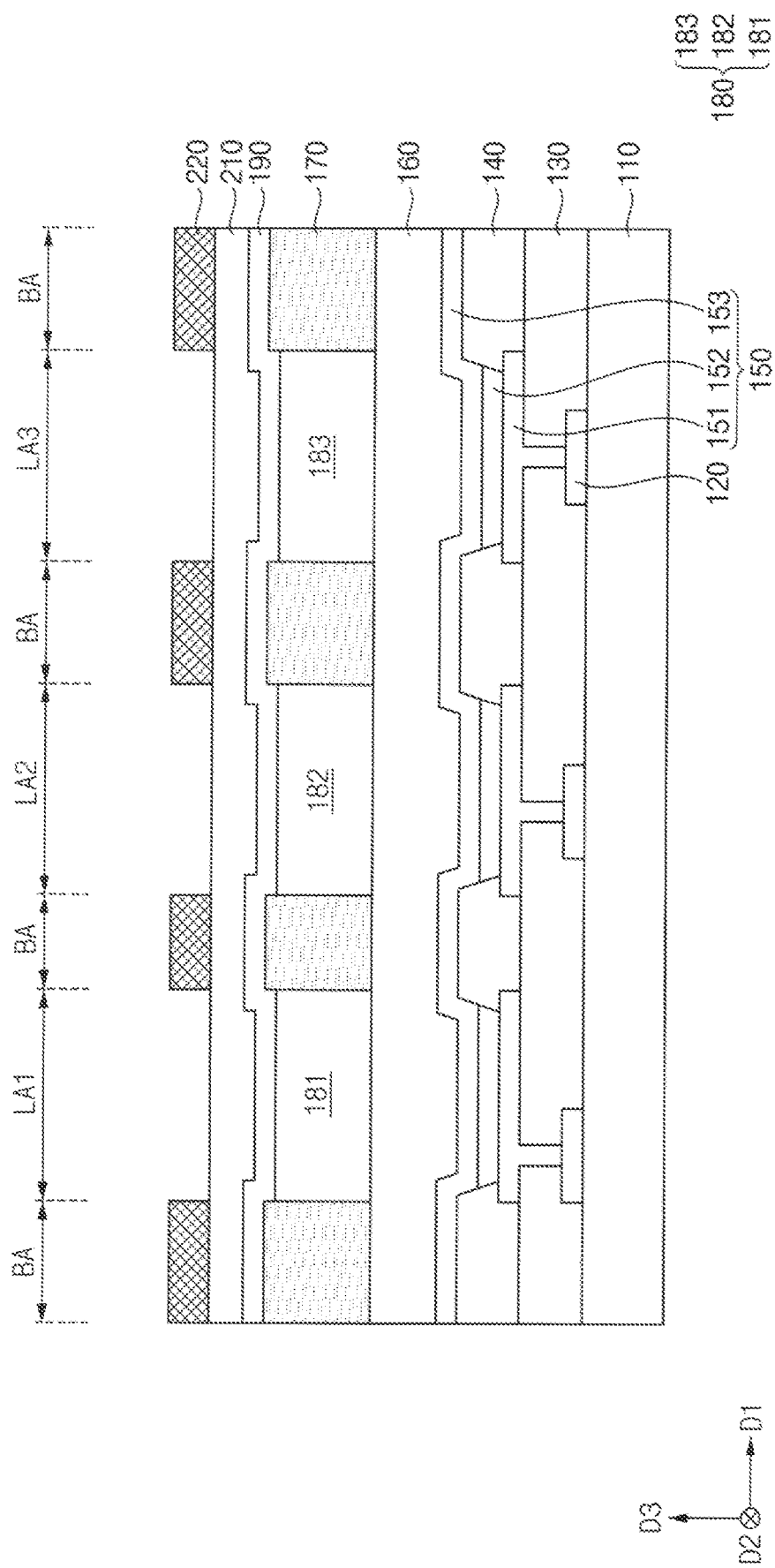

Referring to FIG. 9, the light blocking layer 220 may be formed on the low refractive index layer 210. The light blocking layer 220 may be formed to overlap the light blocking area BA in a plan view. For example, the light blocking layer 220 may be formed using an organic material. In addition, the light blocking layer 220 may be formed by further using a black light blocking material.

Figure 10:
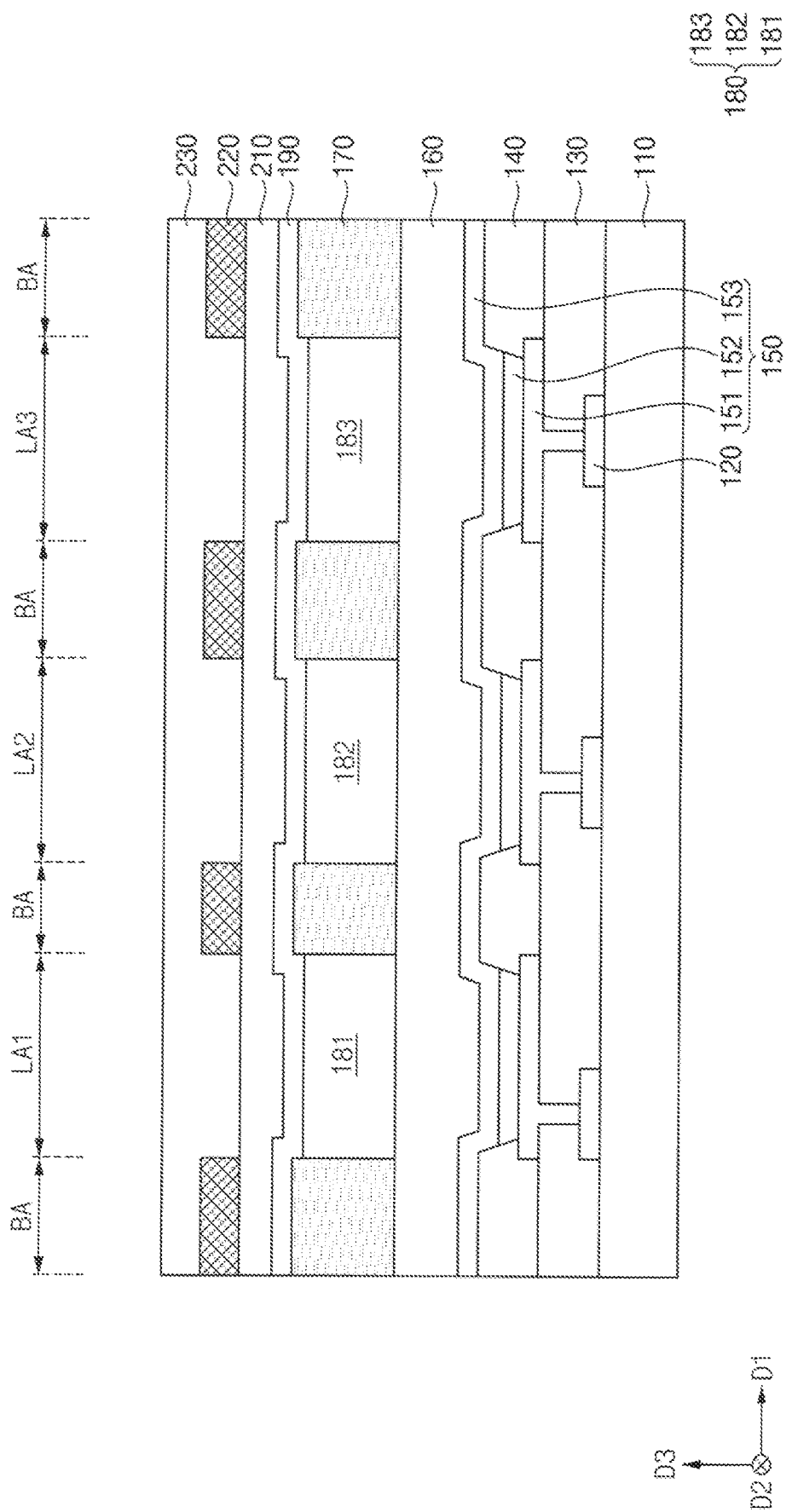

Referring to FIG. 10, the anti-reflection layer 230 may be formed on the low refractive index layer 210. The anti-reflection layer 230 may be formed in an entirety of the first, second, and third light emitting areas LA1, LA2, and LA3 and the light blocking area BA. For example, the anti-reflection layer 230 may be formed using a thermoset material or a photocurable material. In addition, the anti-reflection layer 230 may be formed by further using a light absorbing material that absorbs visible light. In an embodiment, the anti-reflection layer 230 may be formed through an inkjet printing.

Figure 11:
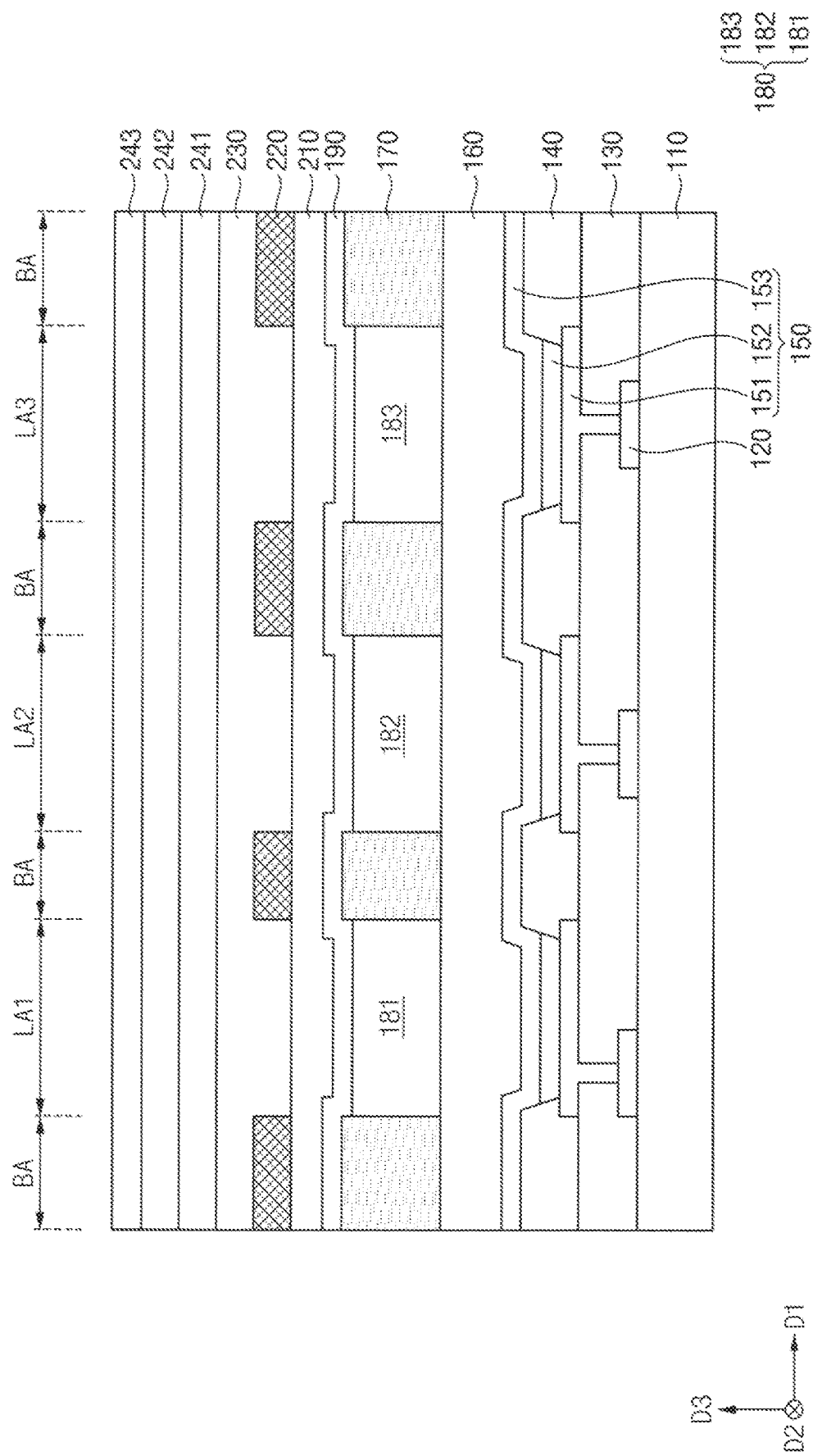

Referring to FIG. 11, the first inorganic layer 241 may be formed on the anti-reflection layer 230. The first inorganic layer 241 may be formed in an entirety of the first, second, and third light emitting areas LA1, LA2, and LA3 and the light blocking area BA. For example, the first inorganic layer 241 may be formed using silicon oxynitride. In an embodiment, the first inorganic layer 241 may be formed through a chemical vapor deposition ("CVD").

The second inorganic layer 242 may be formed on the first inorganic layer 241. The second inorganic layer 242 may be formed in an entirety of the first, second, and third light emitting areas LA1, LA2, and LA3 and the light blocking area BA. For example, the second inorganic layer 242 may be formed using silicon nitride. In an embodiment, the second inorganic layer 242 may be formed through the chemical vapor deposition.

The third inorganic layer 243 may be formed on the second inorganic layer 242. The third inorganic layer 243 may be formed in an entirety of the first, second, and third light emitting areas LA1, LA2, and LA3 and the light blocking area BA. For example, the third inorganic layer 243 may be formed using silicon oxide, silicon oxynitride, or the like. In an embodiment, the third inorganic layer 243 may be formed through the chemical vapor deposition.

That is, the first, second, and third inorganic layers 241, 242, and 243 may be simultaneously formed through the chemical vapor deposition.

Referring back to FIG. 2, the low refractive index layer 244 may be formed on the third inorganic layer 243. The low refractive index layer 244 may be formed in an entirety of the first, second, and third light emitting areas LA1, LA2, and LA3 and the light blocking area BA. For example, the low refractive index layer 244 may include an organic material substituted with fluorine and a plurality of inorganic particles 244' having hollows dispersed inside the organic material. In an embodiment, the low refractive index layer 244 may be formed through the inkjet printing.

Accordingly, the display device 1000 illustrated in FIG. 2 may be manufactured.

Hereinafter, effect of the present disclosure according to examples and comparative examples will be described.

As shown in Table 1 below, according to example 1, comparative example 2 and comparative example 3, a display device including an anti-reflection layer (i.e., to replace color filters configuration) formed using a light absorbing material containing C.I. pigment red-based pigment, C.I. pigment green-based pigment and phthalocyanine-based pigment and polyhedral oligomeric silsesquioxane ("POSS") was manufactured. According to comparative example 1, a display device including an anti-reflection layer formed using only a light absorbing material containing C.I. pigment red-based pigment, C.I. pigment green-based pigment and phthalocyanine-based pigment was manufactured. In addition, according to comparative example 4, a display device including a color filter that selectively transmits light having a specific wavelength and is commonly used was manufactured.

In this case, the display device according to the example 1 and the comparative examples 1, 2, and 3 used a low reflective layer (i.e., the low reflection layer 240a of FIG. 2) including a first inorganic layer, a second inorganic layer, a third inorganic layer and a low refractive index layer and replacing the AR film. The display device according to the comparative example 4 used the AR film. Here, the first inorganic layer was formed using SiON, had a thickness of about 80 nm, and had a refractive index of about 1.611. The second inorganic layer was formed using $SiN_x$, had a thickness of about 135 nm, and had a refractive index of about 1.813. The third inorganic layer was formed using $SiO_x$, had a thickness of about 20 nm, and had a refractive index of about 1.48. The low refractive index layer was formed using fluorinated polyhedral oligomeric silsesquioxane and silica particles having hollows dispersed inside the fluorinated polyhedral oligomeric silsesquioxane, and had a thickness of about 105 nm and a refractive index of about 1.25.

Under the above conditions, a SCI reflectance and a SCE reflectance of the display devices according to examples and comparative examples were measured. The reflectance was measured using a CA-3700 reflectance measuring instrument. Here, the "SCI" is the reflectance including a specular light, and the "SCE" is the reflectance from which the specular light is removed.

TABLE 1

| | Content of light absorbing material (wt %) | Thickness of anti-reflection layer (nm) |
|---|---|---|
| Example 1 | 8 | 3,000 |
| Comparative Example 1 | 100 | 150 |
| Comparative Example 2 | 10 | 600 |
| Comparative Example 3 | 8 | 600 |
| Comparative Example 4 | — | — |

TABLE 2

| | SCI reflectance (%) | SCE reflectance (%) |
|---|---|---|
| Example 1 | 0.61 | 0.17 |
| Comparative Example 1 | 2.21 | 0.17 |
| Comparative Example 2 | 0.55 | 0.29 |
| Comparative Example 3 | 0.60 | 0.32 |
| Comparative Example 4 | 1.6 | 0.9 |

As shown in the Table 2, the SCI reflectance and SCE reflectance of the display device satisfying the example 1 were relatively lower than the SCI reflectance and SCE reflectance of the display device satisfying the comparative examples 1, 2, 3, and 4 can be checked.

Figure 12:
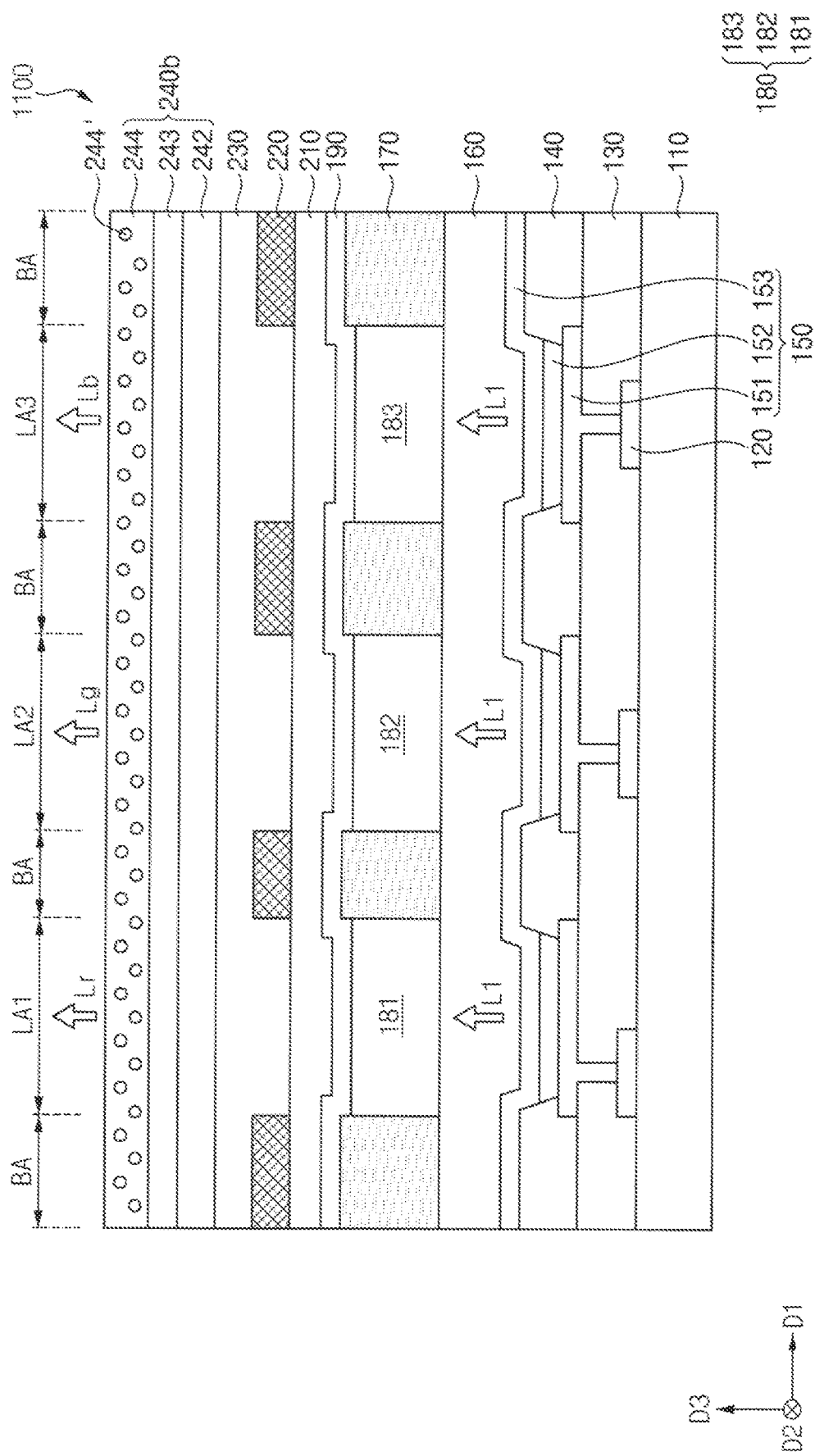
FIG. 12 is a plan view illustrating a display device according to another embodiment.

Through such a result, that the display device 1000 according to an embodiment of the present disclosure has a relatively low reflectance due to external light can be confirmed FIG. 12 is a plan view illustrating a display device according to another embodiment.

Referring to FIGS. 12, a display device 1100 according to another embodiment of the present invention may include a substrate 110, a driving element 120, an insulating structure 130, a pixel-defining layer 140, a light emitting device 150, an encapsulation structure 160, a bank layer 170, a color conversion layer 180, a capping layer 190, a low refractive index layer 210, a light blocking layer 220, an anti-reflection layer 230 and a low reflection layer 240b. However, the display device 1100 described with reference to FIG. 12 may be substantially the same as or similar to the display device 1000 described with reference to FIG. 2 except for the structure of the low reflection layer 240b. Hereinafter, overlapping descriptions will be omitted or simplified.

The driving element 120, the insulating structure 130, the pixel-defining layer 140, the light emitting element 150, the encapsulation structure 160, the bank layer 170, the color conversion layer 180, the capping layer 190, the low refractive index layer 210, the light blocking layer 220, and the anti-reflection layer 230 may be sequentially disposed on the substrate 110.

The low reflection layer 240b may be disposed on the anti-reflection layer 230. The low reflection layer 240a may include a plurality of layers. In an embodiment, the number of the plurality of layers may be three or four. Hereinafter, a case in which the number of the plurality of layers is three will be described as an example.

In an embodiment, the low reflection layer 240b may include a second inorganic layer 242, a third inorganic layer 243 having a refractive index smaller than the refractive index of the second inorganic layer 242, and a low refractive index layer 244 having a refractive index smaller than the refractive index of the third inorganic layer 243. That is, the low reflection layer 240b may not include the first inorganic layer (e.g., the first inorganic layer 241 of FIG. 2) disposed under the second inorganic layer 242.

Figure 13:
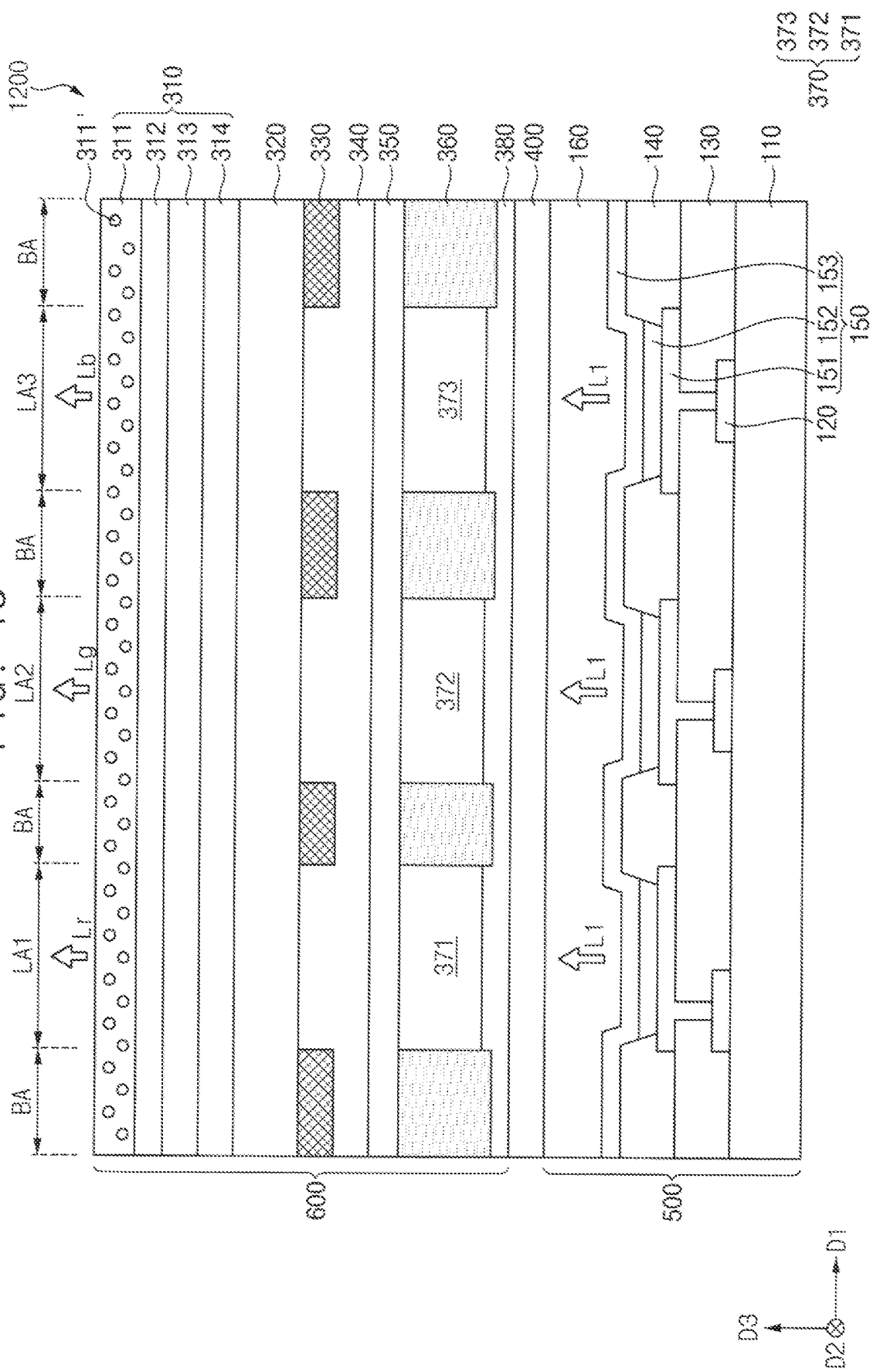
FIG. 13 is a plan view illustrating a display device according to still another embodiment.

FIG. 13 is a plan view illustrating a display device according to still another embodiment.

Referring to FIG. 13, a display device 1200 according to still another embodiment may include an array substrate 500, a color conversion substrate 600, and a filling layer 400 disposed between the array substrate 500 and the color conversion substrate 600. Here, the array substrate 500 may include a substrate 110, a driving element 120, an insulating structure 130, a pixel-defining layer 140, a light emitting element 150, and an encapsulation structure 160. The color conversion substrate 600 may include a low reflection layer 310, a opposite substrate 320, a light blocking layer 330, an anti-reflection layer 340, a first capping layer 350, a bank layer 360, and a color conversion layer 370 and a second capping layer 380.

However, the display device 1200 described with reference to FIG. 13 may be substantially the same as or similar to the display device 1000 described with reference to FIG. 2 except that the display device 1200 has a structure including two substrates. Hereinafter, overlapping descriptions will be omitted or simplified.

The components of the array substrate 500 illustrated in FIG. 13 are the same as components (i.e., the substrate 110, the driving element 120, the insulating structure 130, and the pixel-defining layer 140, the light emitting element 150 and the encapsulation structure 160) of the display device 1000 illustrated in FIG. 2. Therefore, hereinafter, only the color conversion substrate 600 will be described.

The opposite substrate 320 may be formed of or include a transparent resin substrate. For example, the opposite substrate 320 may include an insulating material such as glass or plastic. Alternatively, the opposite substrate 320 may include an organic polymer material such as polycarbonate, polyethylene, polypropylene, or the like. These may be used alone or in combination with each other.

The low reflection layer 310 may be disposed on the opposite substrate 320. The low reflection layer 310 may include a low refractive index layer 311, a first inorganic layer 312 disposed under the low refractive index layer 311, a second inorganic layer 313 disposed under the first inorganic layer 312, and a third inorganic layer 314 disposed under the second inorganic layer 313.

For example, each of the first, second, and third inorganic layers 312, 313, and 314 may include a silicon compound. In and embodiment, the first inorganic layer 312 may include silicon oxynitride or silicon oxide, the second inorganic layer 313 may include silicon nitride, and the third inorganic layer 314 may include silicon oxynitride.

The low refractive index layer 311 may include an organic material and/or an inorganic material. In an embodiment, the low refractive index layer 311 may include an organic material substituted with fluorine and/or an inorganic material substituted with fluorine. In addition, the low refractive index layer 311 may further include a plurality of inorganic particles 311' having hollows dispersed therein.

The refractive index of the low refractive index layer 311 may be smaller than the refractive index of the first inorganic layer 312. The refractive index of the first inorganic layer 312 may be smaller than the refractive index of the second inorganic layer 312. The refractive index of the second inorganic layer 312 may be greater than the refractive index of the third inorganic layer 313. That is, among the low refractive index layer 311, the first inorganic layer 312, the second inorganic layer 313, and the third inorganic layer 313, the second inorganic layer 313 may have the highest refractive index, and the low refractive index layer 311 may have the smallest refractive index.

The light blocking layer 330 may be disposed under the opposite substrate 320. The light blocking layer 330 may overlap the light blocking area BA in a plan view. For example, the light blocking layer 330 may include an organic material and/or an inorganic material. In addition, the light blocking layer 330 may further include a light blocking material such as a black pigment or a black dye.

The anti-reflection layer 340 may be disposed under the opposite substrate 320. The anti-reflection layer 340 may cover an entirety of the light blocking layer 330. For example, the anti-reflection layer 340 may include an organic material and/or an inorganic material. That is, the anti-reflection layer 340 may include a thermoset material or a photocurable material. In addition, the anti-reflection layer 340 may further include a light absorbing material (e.g., a dye and/or a pigment) absorbing visible light.

The first capping layer 350 may be disposed under the anti-reflection layer 340. For example, the first capping layer 350 may include a silicon compound. The bank layer 360 may be disposed under the first capping layer 350. The bank layer 360 may overlap the light blocking area BA in a plan view. For example, the bank layer 360 may include an organic material.

The color conversion layer 370 may be disposed under the first capping layer 350. The color conversion layer 370 may include a first color conversion pattern 371 overlapping the first light emitting area LA1, a second color conversion pattern 372 overlapping the second light emitting area LA2, and a light transmission pattern 373 overlapping third light emitting area LA3 in a plan view.

The second capping layer 380 may be disposed under the bank layer 360 and the color conversion layer 370. The second capping layer 380 may cover an entirety of the bank layer 360 and the color conversion layer 370. For example, the second capping layer 380 may include a silicon compound.

The filling layer 400 may be disposed between the array substrate 500 and the color conversion substrate 600. The filling layer 400 may fill between the array substrate 500 and the color conversion substrate 600. The filling layer 400 may include a material capable of transmitting light. For example, the filling layer 400 may include an organic material. Alternatively, the filling layer 400 may be omitted.

That is, although that the display device 1000 has a single substrate structure as an example has been described in FIG. 2, the present disclosure is not limited thereto. For example, as illustrated in FIG. 13, the display device 1200 may have a structure including two substrates (i.e., the substrate 110 and the opposite substrate 320) in another embodiment.

The present disclosure can be applied to various display devices. For example, the present disclosure is applicable to various display devices such as display devices for vehicles, ships and aircraft, portable communication devices, display devices for exhibition or information transmission, medical display devices, or the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display device comprising:
   a substrate including first, second, and third emitting areas and a light blocking area surrounding the first, second, and third emitting areas;
   light emitting elements disposed in the first, second, and third light emitting areas, respectively, on the substrate;
   a color conversion layer including a first color conversion pattern, a second color conversion pattern, and a light transmission pattern disposed in the first, second, and third emitting areas on the light emitting elements;
   a light blocking layer disposed in the light blocking area on the color conversion layer;
   an anti-reflection layer covering the light blocking layer on the color conversion layer; and
   a low reflection layer disposed on the anti-reflection layer and including a plurality of layers having different refractive indices from each other,
   wherein the plurality of layers includes:
   a first inorganic layer disposed on the anti-reflection layer and of which a refractive index is about 1.6 to about 1.7;
   a second inorganic layer disposed on the first inorganic layer and of which a refractive index is about 1.7 to about 1.9;
   a third inorganic layer disposed on the second inorganic layer and of which a refractive index is about 1.4 to about 1.7; and
   a lower refractive index layer disposed on the third inorganic layer and of which a refractive index is about 1.25 to about 1.39.

2. The display device of claim 1, wherein a thickness of the first inorganic layer is about 50 nanometers (nm) to about 150 nm.

3. The display device of claim 1, wherein a thickness of the second inorganic layer is about 50 nm to about 150 nm.

4. The display device of claim 1, wherein a thickness of the third inorganic layer is about 20 nm to about 50 nm.

5. The display device of claim 1, wherein each of the first, second, and third inorganic layers includes at least one selected from a group consisting of silicon oxide ($SiO_x$), silicon nitride ($SiN_x$), and silicon oxynitride (SiON).

6. The display device of claim 5, wherein the first inorganic layer includes silicon oxynitride, the second inorganic layer includes silicon nitride, and the third inorganic layer includes at least one selected from a group consisting of silicon oxide and silicon oxynitride.

7. The display device of claim 1, wherein the low refractive index layer includes at least one selected from a group consisting of an inorganic material substituted with fluorine and an organic material substituted with fluorine.

8. The display device of claim 7, wherein the low refractive index layer further includes a plurality of inorganic particles having hollows dispersed therein.

9. The display device of claim 8, wherein each of the inorganic particles includes at least one selected from a group consisting of silica ($SiO_2$), magnesium fluoride ($MgF_2$), and iron oxide ($Fe_3O_4$).

10. The display device of claim 1, wherein the anti-reflection layer includes a thermoset material or photocurable material.

11. The display device of claim 10, wherein the anti-reflection layer further includes a light absorbing material including a pigment or a dye, which absorbs visible light.

12. The display device of claim 11, wherein when a content of the light absorbing material is about 8 percentages by weight (wt %) to about 10 wt %, a thickness of the anti-reflection layer is about 2,000 nm to about 4,000 nm.

13. The display device of claim 11, wherein when a content of the light absorbing material is about 20 wt % to about 50 wt %, a thickness of the anti-reflection layer is about 300 nm to about 1,000 nm.

14. The display device of claim 1, wherein the first color conversion pattern converts light emitted from a first light emitting element of the light emitting elements into light of a first color, the second color conversion pattern converts light emitted from a second light emitting element of the light emitting elements into light of a second color, and the light transmission pattern transmits light emitted from a third light emitting element of the light emitting elements.

15. The display device of claim 14, wherein the first color is red, the second color is green, and the light emitted from the light emitting elements is blue light.

16. A display device comprising:
a substrate including first, second, and third emitting areas and a light blocking area surrounding the first, second, and third emitting areas;
light emitting elements disposed in the first, second, and third light emitting areas, respectively, on the substrate and, which emits blue light;
a color conversion layer including a first color conversion pattern, which converts the blue light into red light, a second color conversion pattern, which converts the blue light into green light, and a light transmission pattern, which transmits the blue light, wherein the first color conversion pattern, the second color conversion pattern, and the light transmission pattern are disposed in the first, second, and third emitting areas on the light emitting elements, respectively;
a light blocking layer disposed in the light blocking area on the color conversion layer;
an anti-reflection layer disposed on the color conversion layer and including a light absorbing material, which absorbs visible light; and
a low reflection layer disposed on the anti-reflection layer and including a plurality of inorganic layers having different refractive indices from each other, and a low refractive index layer disposed on the inorganic layers and having a smaller refractive index than each of the inorganic layers,
wherein the plurality of inorganic layers includes:
a first inorganic layer disposed directly on the anti-reflection layer and of which refractive index is about 1.7 to about 1.9; and
a second inorganic layer disposed directly on the first inorganic layer and of which refractive index is about 1.4 to about 1.7.

\* \* \* \* \*